United States Patent [19]

Ogawa et al.

[11] Patent Number: 5,401,701
[45] Date of Patent: Mar. 28, 1995

[54] ITO SINTERED BODY AND METHOD OF MANUFACTURING THE SAME

[75] Inventors: Nobuhiro Ogawa, Tokuyama; Kimitaka Kuma; Chikara Uema, both of Shinnanyo; Kazuaki Yamamoto, Tokuyama; Ryoji Yoshimura, Yamagata; Takashi Mouri, Hikari, all of Japan

[73] Assignee: Tosoh Corporation, Shinnanyo, Japan

[21] Appl. No.: 105,425

[22] Filed: Aug. 13, 1993

[30] Foreign Application Priority Data

Aug. 19, 1992 [JP] Japan .................. 4-241396
Dec. 16, 1992 [JP] Japan .................. 4-336161
Dec. 25, 1992 [JP] Japan .................. 4-345876

[51] Int. Cl.$^6$ .................................. C04B 35/50
[52] U.S. Cl. .................. 501/134; 501/126; 423/624
[58] Field of Search ............... 501/126, 134; 204/298.12, 298.13, 192.29; 423/624

[56] References Cited

U.S. PATENT DOCUMENTS 4,690,745  9/1987  Klein .................. 204/192.29
5,071,800  12/1991  Iwamoto et al. .......... 501/126
5,094,787  3/1992  Nakajima et al. ......... 501/126

FOREIGN PATENT DOCUMENTS 0386932  9/1990  European Pat. Off. .
405148638  6/1993  Japan .................. 204/298.13
2236309  4/1991  United Kingdom .

OTHER PUBLICATIONS

Chemical Abstracts, vol. 91, No. 10, Sep. 3, 1979, AN-76278w, & Database WPI, AN-79-38127B JP-A-54 045 697, Apr. 11, 1979.
Database WPI, AN-87-052878, JP-A-62 007 627, Jan. 14, 1987.

*Primary Examiner*—Karl Group
*Attorney, Agent, or Firm*—Oblon, Spivak, McClelland, Maier & Neustadt

[57] ABSTRACT

An ITO sintered body according to the present invention has a density thereof of between 90 and 100% and a sintering particle size of between 1 and 20 μm. A proportion of $(In_{0.6}Sn_{0.4})_2O_3$ in the ITO sintered body is 10% or below. Such an ITO sintered body is manufactured by mixing an indium oxide powder, whose BET surface area is between 15 and 30 m$^2$/g, a BET size/a crystallite size is 2 or below, and an average primary particle size is between 0.03 and 0.1 μm, with tin oxide whose BET surface area is 3 m$^2$/g or below, and then by sintering the mixture.

10 Claims, No Drawings

ITO SINTERED BODY AND METHOD OF MANUFACTURING THE SAME

BACKGROUND OF THE INVENTION

Field of the Invention

The present invention relates to a high-density ITO sintered body, an indium oxide powder and a tin oxide powder which are used as materials thereof, a method of manufacturing such a high-density ITO sintered body, and a method of manufacturing such powders.

Development of display devices, such as liquid crystal display devices, has increased the demand for transparent conductive films. An ITO (indium oxide, tin oxide) film is extensively used among various types, as the transparent conductive film for the liquid crystal device because of its low resistance and high transparency. The ITO transparent conductive film is generally formed by sputtering because of the simplicity of the operability thereof, particularly, by sputtering which employs an ITO sintered body target. Development of color liquid crystal display devices, adoption of the active matrix drive and advance of miniaturization of the devices are recent trends in this field. These have increased the demand for formation of high performance ITO transparent conductive films at a low temperature.

The present invention relates to an ITO sintered body target used when a transparent conductive film is formed by sputtering, an indium oxide powder and a tin oxide powder which are the materials thereof, a method of manufacturing such an ITO sintered body target and a method of manufacturing such powders.

Description of the Related Art

ITO sintered body is generally manufactured first by forming a mixture of an indium oxide powder and a tin oxide powder under pressure and then by sintering that mixture.

The indium oxide powder and the tin oxide powder or an ITO powder, which are used as the materials of such an ITO sintered body, are manufactured by thermal decomposition of metal hydroxides, organic metal salts, inorganic metal salts, sols or gels of such metals or by heating decomposition of either a product, obtained by coprecipitating a uniformly mixed solution of indium and tin by the addition of a precipitant thereto, or of a product obtained by hydrolysis of the uniformly mixed solution.

However, it is difficult to obtain a high density sintered body from the material powders obtained by the above-described methods, and the density of the obtained ITO sintered body is generally about 65% of the theoretical density (7.15 g/cm$^3$) thereof, which is no more than 4.65 g/cm$^3$. The ITO sintered body having such a low density does not have sufficient electrical conductivity, and has low thermal conductivity and transverse rupture strength. Therefore, the use of such an ITO sintered body as a sputtering target makes it very difficult to form a high performance ITO film exhibiting excellent conductivity and light transmittance. It also deteriorates the sputtering operability, for example, generates nodules by reduction of the target surface or delays the film formation speed.

In order to solve such problems, various proposals have been made regarding the method of manufacturing a high density ITO sintered body.

In one method, an indium oxide powder having an average particle size of 3 through 6 $\mu$m, obtained by temporarily sintering the indium oxide powder, is employed (proposed in, for example, Japanese Patent Laid-Open No. sho 62-21751). However, it is difficult to obtain a high density sintered body having a density exceeding 70% (5 g/cm$^3$) from the material powder having such a relatively large particle size.

In another method (proposed in, for example, Japanese Patent Laid-Open No. sho 59-136480), a high density sintered body is obtained by the hot press method. However, hot press sintering requires very expensive manufacturing equipment, and it is difficult to manufacture a transparent conductive film having excellent performance by hot press sintering because of reduction of the obtained sintered body. In addition, although the hot press sintered body has a fine structure, it has a particle size of less than 1 $\mu$m. Therefore, the hot press sintered body has insufficient mechanical strength, and readily cracks. The use of such a sintered body as a sputtering target will cause a problem.

In still another method (proposed in, for example, Japanese Patent Laid-Open No. hei 3-207858), sintering is performed in an oxygen atmosphere at a high temperature under pressure. However, pressurization sintering requires an expensive manufacturing facility, like hot press sintering. In addition, because sintering is conducted at a high temperature of 1600° C. or above, growth of abnormal particles readily occurs. Also, the particle size of the sintered body exceeds 30 $\mu$m. Therefore, the thermal shock resistance of the target is insufficient, and cracking readily occurs. The use of such a sintered body will cause a problem, as in the case of hot press sintering.

In still another method (proposed in, for example, Japanese Patent Laid-Open No. sho 61-136954), a sintering assistant, such as Si or Ge, is added. However, in this method, Si or Ge enters the transparent conductive film, making formation of a film having a low resistance difficult.

The present inventors have also proposed a method of manufacturing a high-density ITO sintered body by using a powder whose primary particle size is 1 $\mu$m or below and the BET specific surface area is 15 m$^2$/g or above (in, for example, Japanese Patent Laid-Open Nos. hei 2-297813 and 3-218924). However, there is a demand for a higher density ITO sintered body.

In view of the above-described situation, the present inventors made intensive studies regarding the sintering density and sintering particle size of an ITO target and the sputtering characteristics thereof required when the ITO target was used to form a transparent conductive film, and came to the conclusion that when sputtering was performed using, as a target, a high-density ITO sintered body whose sintering density was 90 to 100% and sintering particle size was 1 $\mu$m to 20 $\mu$m, a highly transparent conductive film having a very low resistance could be formed on a substrate at a high film formation speed whether the substrate was high-temperature heated or low-temperature non-heated. Also high productivity could be obtained because there was no granular product on the target surface and because neither cracking of the target nor scattering of broken particles from the target occurred.

Further, the present inventors discovered that an ITO sintered body which contained 10% or less of solid solution of indium and tin, a byproduct generated in the ITO sintered body, could be an excellent high-performance sputtering target and assured formation of a film having a low resistance.

Also, the present inventors found that such an ITO sintered body could be manufactured by using, as materials, both an indium oxide powder whose BET specific surface area was 15 to 30 m$^2$/g, a BET size/a crystallite size of 2 or below and an average primary particle size of 0.03 to 0.1 μm and a tin oxide powder whose BET surface area was 3 m$^2$/g or below.

The present invention will now be described in detail.

The sintering density of the ITO sintered body according to the present invention is 90 to 100%. The true density of ITO which contains 10% of tin oxide is 7.15 g/cm$^3$. Therefore, the density of the sintered body according to the present invention is between 6.43 g/cm$^3$ and 7.15 g/cm$^3$.

A preferable proportion of tin in the ITO sintered body according to the present invention in terms of tin oxide is, in weight percent, from 1 to 20, with more preferable proportion ranging from 2 to 15.

The sintering particle size of the ITO sintered body according to the present invention is from 1 to 20 μm, particularly, from 2 to 20 μm. The sintering particle size of the conventional high-density sintered body obtained by hot press is less than 1 μm, and that of the conventional high-density sintered body obtained by the pressurized high-temperature sintering in oxygen atmosphere is 30 μm or above. The use of a sintered body whose sintering particle size is less than 1 μm slows down the film forming speed. Further, since such a sintered body has a low strength, it may crack or may break with the broken particles scattering in a film during sputtering. A sintered body whose sintering particle size exceeds 20 μm has a low shock resistance and thus readily cracks. Further, since such a sintered body has a high coefficient of thermal expansion, it may peel off from the bonding surface or may readily crack during sputtering. The transverse rupture strength (mechanical strength) of the ITO sintered body having a sintering particle size defined by the present invention is 5 to 50 kg/mm$^2$.

The specific resistance of the ITO sintered body according to the present invention is $1\times10^{-3}$ Ω cm or below, particularly, from $7\times10^{-4}$ to $5\times10^{-5}$ Ω cm. Since the sintered body having such a low resistance consumes less electric power and allows for discharge at a low voltage, damage to the film due to the negative ions generated in a plasma can be reduced. Consequently, a film having a low resistance can be obtained.

The coefficient of thermal conduction of the ITO sintered body according to the present invention is from $15\times10^{-3}$ to $40\times10^{-3}$ cal/cm.sec. The coefficient of the thermal expansion of the ITO sintered body according to the present invention is from $7\times10^{-6}$ to $1\times10^{-5}$/° C.

Furthermore, when the proportion of a solid solution ((In$_{0.6}$Sn$_{0.4}$)$_2$O$_3$) of indium oxide and tin oxide in the ITO sintered body according to the present invention is between 0% and 10%, the ITO sintered body exhibits excellent properties. The preferable proportion of the solid solution is between 0% and 7%, with more preferable proportion ranging between 1% and 5%. The obtained proportion is a rate relative to the sum of the integrated intensity of indium oxide (2θ=30.5 degrees), the integrated intensity of tin oxide (2θ=26.6 degrees) and the integrated intensity of the solid solution ((In$_{0.6}$Sn$_{0.4}$)$_2$O$_3$) (2Θ=30.2 degrees), which is 100, obtained by X-ray diffraction. To calculate the integrated intensity of indium oxide and that of the solid solution, having close angles of diffraction, the diffraction patterns are separated. These calculations conform to Journal of Applied Crystallography, 19, 440 (1986).

In the conventional ITO sintered body, tin oxide is present in the form of a solid solution alone, and no tin oxide can thus be measured by X-ray diffraction. However, in the sintered body according to the present invention, tin oxide in a non solid solution state is present. This is observed by X-ray diffraction measurement. The proportion of tin oxide present in the sintered body according to the present invention in a non solid solution state is between 1% and 5%.

In the solid solution of indium oxide and tin oxide, the proportion of tin is excessive (In/Sn=1.5) compared with that in the ITO composition (In/Sn=about 6). Thus, distribution of tin in the solid solution is non uniform. The possibility that such a solid solution is generated increases, as the sintering temperature increases, as the divided pressure of oxygen in the sintering atmosphere increases or as the fineness and uniformity with which tin oxide is dispersed increases.

The indium oxide powder, the excellent material of the sintered body according to the present invention, will be described.

The BET surface area of the indium oxide powder according to the present invention is from 15 to 30 m$^2$/g. An indium oxide powder whose BET surface area is less than 15 m$^2$/g is rough and thus exhibits a degraded degree of sintering. An indium oxide powder whose BET surface area exceeds 30 m$^2$/g is porous or coherent and thus exhibits a degraded degree of sintering.

The BET size/the crystallite size of the indium oxide powder according to the present invention is 2 or below, with preferable rate between 1.0 and 1.8 and more preferable rate between 1.1 and 1.8. Since a powder whose BET size/the crystallite size is 2 or below is composed of single crystals or is an aggregate of relatively small crystallites, it exhibits excellent degree of sintering. A powder whose BET size/the crystallite size exceeds 2 is an aggregate of crystallites having a small particle size, and thus exhibits a degraded degree of sintering. The size of the crystallites can be obtained from the half value width of the diffraction peak of (222) of indium oxide by X-ray diffraction. The diffraction peak of (222) of indium oxide by X-ray diffraction appears at 2θ=30.5 degrees. The BET size is obtained by measuring the BET specific surface area of the powder and then by approximating the particles to spheres.

The average primary particle size of the indium oxide powder according to the present invention can be obtained by either particle size distribution measurement or electronic microscope observation. The actual particle size is between 0.03 μm and 0.1 μm. A powder whose average particle size is less than 0.03 μm is very coherent and thus has a degraded degree of sintering. A powder whose particle size exceeds 0.1 μm has a small surface area and thus has a degraded degree of sintering. The average primary particle size is obtained by means of the particle size distribution measurement by sufficiently dispersing the particles in an aqueous solution thereof (by, for example, conducting dispersion using ultrasonic waves for an hour or longer after a small amount of dispersing agent is added) and then by conducting measurement of a distribution of particle size of 0.12 μm or below. The average secondary particle size can also be obtained by means of the particle size distribution measurement by conducting the same dispersion treatment. The average secondary particle size is 1 μm or below.

The primary particles can be observed with an electronic microscope by the same method as that of a conventional powder observation operation at a magnification between ×100,000 and ×300,000. In the case of observing the particle size and shape, the use of a transmission type electronic microscope is desirable.

The indium oxide powder whose BET specific surface area is 10 to 30 $m^2/g$, the BET size/the crystalline size is 2 or below and the average primary particle size is from 0.03 to 0.1 μm has a very high degree of sintering, and is thus suitable as the material of the high-density ITO sintered body according to the present invention.

The method of manufacturing the indium oxide powder having the above-described properties will be described below. In a practical operation, the indium oxide powder is manufactured by producing indium hydroxide from a mixture of an indium salt aqueous solution having a temperature of 60° to 100° C. and an alkali aqueous solution and then by conducting washing, filtering, drying and calcing on the produced indium hydroxide. The indium salt aqueous solution and the alkali aqueous solution are mixed in such a manner that [OH]/[In] ratio ranges from 3 to 5:

(A) by supplying the alkali aqueous solution into the indium salt aqueous solution at a mixing speed [OH]/[In] of 0.15 or above per minute, (B) by supplying the indium salt aqueous solution into the alkali aqueous solution at a mixing speed [In]/[OH] of 0.01 or above per minute, or (C) by continuously supplying the indium salt aqueous solution and the alkali aqueous solution.

There is no limitation to the type of indium salt aqueous solution employed in the present invention, and indium nitrate or indium sulfate aqueous solution may be employed. A preferable concentration of the indium salt aqueous solution is between 0.01 mol/l and 5 mol/l with more preferable one ranging from 0.3 mol/l to 2.0 mol/l. A concentration of less than 0.01 mol/l deteriorates productivity. More than 5 mol/l may make the solution gelatinize. The gelatinized solution is not easy to handle. The method according to the present invention differs from the conventional fine particle manufacturing method in the use of such a concentrated solution.

An aqueous solution of sodium hydroxide, potassium hydroxide, urea or ammonia can be employed as the alkali aqueous solution employed in the present invention. However, from the viewpoint of elimination of the residual metal ions in the indium hydroxide, the use of an aqueous solution of urea or ammonia is desirable. There is no limitation to the concentration of the alkali aqueous solution.

The quantity of alkali aqueous solution can be any value, as long as that quantity ensures that pH of the mixture solution is 7 or above. The quantity of hydroxide ions relative to indium ions in the indium salt aqueous solution is 3 to 5 in terms of mol ratio.

Mixture of the indium aqueous solution and the alkali aqueous solution is conducted under either of the following conditions:

(A) By supplying the alkali aqueous solution into the indium salt aqueous solution at a mixing speed [OH]/[In] of 0.15 or above per minute, preferably, at a speed from 0.15 to 300 per minute, and more preferably, at a speed from 1 to 30 per minute, (B) By supplying the indium salt aqueous solution into the alkali aqueous solution at a mixing speed [In]/[OH] of 0.01 or above per minute, preferably, at a speed from 0.01 to 1.2 per minute, and more preferably, at a speed from 0.04 to 1.2 per minute, or (C) By continuously supplying the indium salt aqueous solution and the alkali aqueous solution.

The powder having the above-described properties can be obtained when the indium salt aqueous solution and the alkali aqueous solution are mixed at either of the above-described mixing speeds. A mixing speed which is slower than the mixing speed range of the present invention increases the particle size of the powder and agglomerates the powder, thus generating a distribution in the powder.

A preferable temperature for crystallization is between 60° and 100° C., with more preferable temperature range from 70° to 95° C. A crystallization temperature of lower than 60° C. produces indium hydroxide having an excessively small particle size. Such an indium hydroxide agglomerates during calcing, and makes provision of fine indium oxide powder exhibiting excellent degree of sintering impossible. A crystallization temperature exceeding 100° C. causes hydrolysis of the indium salt aqueous solution to take place. Thus, the produced indium hydroxide powder contains a powder having a large particle size.

Generally, crystallization is conducted while the solutions are being stirred. After crystallization is completed, stirring may be continued for another several tens of minutes to several hours to mix the slurry and thereby make the slurry uniform.

Next, the indium hydroxide slurry obtained in the above-described manner is washed and then solid-liquid separation is conducted on the washed slurry. There is no limitation to the method of solid-liquid separation. For example, Nutsche, a drum filter, a filter press or a belt filter may be used.

Thereafter, indium hydroxide obtained in the manner described above is dried. The drying temperature is from 90° to 260° C. A drying temperature of lower than 90° C. deteriorates drying efficiency. A drying temperature of higher than 260° C. oxidizes part of indium hydroxide, thus making the indium hydroxide powder non-uniform.

Dried indium hydroxide is lightly cracked in order to improve dispersibility. At that time, strong cracking is not necessary, unlike the case of a conventional method. Strong cracking may reduce the crystallinity. There is no limitation to the cracking method. An automatic mortar or a hammer mill may be used.

The indium oxide powder is manufactured by calcing the indium hydroxide powder obtained in the manner described above. A preferable calcing temperature is between 500° and 900° C., with more preferable temperature range between 550° and 850° C. A calcing temperature of less than 500° C. reduces the density of the product, thus making the provision of a high-density ITO sintered body impossible. A calcing temperature of higher than 900° C. advances sintering of the indium oxide powder. Consequently, the degree of sintering of the powder is reduced and a high-density ITO sintered body cannot thus be obtained. The calcing time is between 1 and 10 hours.

It is possible to obtain a high-density sintered body in which the presence of a solid solution of indium and tin is less by using tin oxide whose BET surface area is 3 m$^2$/g or below. A preferable BET surface area is from 0.001 m$^2$/g to 3 m$^2$/g, with more preferable surface area from 0.05 m$^2$/g to 0.5 m$^2$/g. Tin oxide having a BET surface area of more than 3 m$^2$/g makes the provision of a high-density ITO sintered body impossible or readily generates a solid solution of indium and tin in the obtained sintered body.

Such a tin oxide can be obtained by heat treating tin oxide or hydroxide tin salt, which is an precursor of tin oxide, at a temperature of 1000° C. or above, preferably, at a temperature between 1200° and 1800° C. Heating is performed in an atmosphere or oxygen or inactive gas atmosphere for 0.5 to 10 hours, preferably, for 2 to 5 hours.

A preferable particle size of tin oxide is between 0.3 μm and 50 μm, with more preferable size ranging between 5 μm and 20 μm. Next, the method of manufacturing the high-density ITO sintered body according to the present invention will be described below.

The ITO powder employed to manufacture the ITO sintered body is prepared by mixing the indium oxide powder and the tin oxide powder.

A preferable proportion of tin oxide relative to the indium oxide powder is between 3 wt % and 15 wt %. There is no limitation to the method of mixing the indium oxide powder and the tin oxide powder, and either a wet or dry mixing method, which employs, for example, a ball mill employing a ball made of zirconia or urethane resin, a vibration mill, or a V type blender may be employed.

Next, the ITO powder is formed. A forming method suited to the desired shape is employed. Examples thereof include molding and casting, such as slurry casting.

In order to increase the density of the sintered body, it is preferable for the formed part to be pressurized by cold hydrostatic press (CIP) under a pressure of 3 to 5 t/cm$^2$. When necessary, the same treatment is repeated two to five times.

The obtained formed part is sintered at a temperature between 1250° C. to 1600° C., preferably, between 1350° C. and 1500° C. A sintering temperature of lower than 1250° C. provides an ITO sintered body having a density of less than 90%. A sintering temperature of higher than 1600° C. may evaporate tin oxide or generate abnormal growth of the sintered body particles. A preferable sintering time is between 1 and 24 hours, with more preferable sintering time being from 5 to 10 hours. There is no limitation to the sintering atmosphere. Sintering may be conducted in an atmosphere or oxygen or inactive gas atmosphere.

Thus, an ITO sintered body having a density of 90% or above and exhibiting excellent characteristics can be obtained.

The high-density ITO sintered body according to the present invention exhibit very excellent performance as a sputtering target. Furthermore, the manufacturing method according to the present invention enables a high-density ITO sintered body to be manufactured under the atmospheric pressure and thus enables excellent target to be manufactured at a low cost.

Examples

Examples of the present invention will now be described. However, the present invention is not limited by these examples.

EXAMPLE 1

Aqueous ammonia was mixed into a 0.5 mol/l indium nitrate aqueous solution having a temperature of 85° C. at a mixing speed [OH]/[In] of 0.8 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 22 m$^2$/g. The crystallite size of the indium oxide powder by X-ray diffraction was 400 Å. The primary particle size obtained by the particle size distribution measurement was 0.08 μm (the BET size/the crystallite size = 1.13).

Such an induim oxide powder was mixed with a tin oxide powder whose BET surface area was 2.0 m$^2$/g in such a manner that the proportion of tin oxide was 10 wt %. Thereafter, the mixture powder was molded under a pressure of 1.5 ton/cm$^2$. After the molded part was treated by cold hydrostatic press under a pressure of 3 ton/cm$^2$, it was sintered under the atmospheric pressure at 1400° C. for 5 hours. The diameter of the obtained sintered body was 100 mm Φ. The density of the sintered body was 94% of the theoretical density thereof, which was 6.7 g/cm$^3$. The sintered particle size was 8 μm.

EXAMPLE 2

Aqueous ammonia was mixed into a 0.5 mol/l indium nitrate aqueous solution having a temperature of 85° C. at a mixing speed [OH]/[In] of 0.2 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 650° C. for 4 hours to manufacture an indium oxide powder. The BET specific surface area of the indium oxide powder was 29 m$^2$/g. The crystallite size of the indium oxide powder by X-ray diffraction was 270 Å. The primary particle size obtained by the particle size distribution measurement was 0.07 μm (the BET size/the crystallite size = 1.07).

Such an indium oxide powder was mixed with a tin oxide powder whose BET surface area was 2.0 m$^2$/g in such a manner that the proportion of tin oxide was 10 wt %. Thereafter, the mixture powder was molded and sintered in the same manner as that of Example 1. The density of the obtained sintered body was 94% of the theoretical density thereof, which was 6.7 g/cm$^3$. The sintered particle size was 7 μm.

EXAMPLE 3

Aqueous ammonia was mixed into a 0.6 mol/l indium nitrate aqueous solution having a temperature of 85° C. at a mixing speed [OH]/[In] of 1.0 per minute to obtain a slurry. The proportion of aqueous ammonia was 10 wt % which ensured a [OH]/[In] ratio of 3.5. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 22 m²/g. The crystallite size of the indium oxide powder by X-ray diffraction was 400 Å. The primary particle size obtained by the particle size distribution measurement was 0.08 μm (the BET size/the crystallite size=1.13).

Such an indium oxide powder was mixed with a tin oxide powder whose BET surface area was 2.0 m²/g in such a manner that the proportion of tin oxide was 10 wt %. Thereafter, the mixture powder was molded and sintered in the same manner as that of Example 1. The density of the obtained sintered body was 98% of the theoretical density thereof, which was 7.0 g/cm³. The sintered particle size was 9 μm.

EXAMPLE 4

Aqueous ammonia was mixed into a 1.5 mol/l indium nitrate aqueous solution having a temperature of 85° C. at a mixing speed [OH]/[In] of 0.8 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 22 m²/g. The crystallite size of the indium oxide powder by X-ray diffraction was 450 Å. The primary particle size obtained by the particle size distribution measurement was 0.08 μm (the BET size/the crystallite size=1.01).

Such an indium oxide powder was mixed with a tin oxide powder whose BET surface area was 2.0 m²/g in such a manner that the proportion of tin oxide was 10 wt %. Thereafter, the mixture powder was molded and sintered in the same manner as that of Example 1. The density of the obtained sintered body was 94% of the theoretical density thereof, which was 6.7 g/cm³. The sintered particle size was 8 μm.

EXAMPLE 5

Aqueous ammonia was mixed into a 0.4 mol/l indium nitrate aqueous solution having a temperature of 60° C. at a mixing speed [OH]/[In] of 0.8 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 21 m²/g. The crystallite size of the indium oxide powder by X-ray diffraction was 400 Å. The primary particle size obtained by the particle size distribution measurement was 0.09 μm (the BET size/the crystallite size=1.14).

Such an indium oxide powder was mixed with a tin oxide powder whose BET surface area was 2.0 m²/g in such a manner that the proportion of tin oxide was 10 wt %. Thereafter, the mixture powder was molded and sintered in the same manner as that of Example 1. The density of the obtained sintered body was 94% of the theoretical density thereof, which was 6.7 g/cm³. The sintered particle size was 8 μm.

EXAMPLE 6

Aqueous ammonia was mixed into a 0.8 mol/l indium nitrate aqueous solution having a temperature of 95° C. at a mixing speed [OH]/[In] of 0.8 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 21 m²/g. The crystallite size of the indium oxide powder by X-ray diffraction was 450 Å. The primary particle size obtained by the particle size distribution measurement was 0.09 μm (the BET size/the crystallite size=1.01).

Such an indium oxide powder was mixed with a tin oxide powder whose BET surface area was 2.0 m²/g in such a manner that the proportion of tin oxide was 10 wt %. Thereafter, the mixture powder was molded and sintered in the same manner as that of Example 1. The density of the obtained sintered body was 92% of the theoretical density thereof, which was 6.6 g/cm³. The sintered particle size was 8 μm.

EXAMPLE 7

The indium oxide powder was manufactured in the same manner as that of Example 1. Such an indium oxide powder was mixed with a tin oxide powder whose BET surface area was 2.0 m²/g in such a manner that the proportion of tin oxide was 10 wt %. After the mixture powder was molded in the same manner as that of Example 1, it was sintered in the atmosphere at 1550° C. for 5 hours. The density of the obtained sintered body was 98% of the theoretical density thereof, which was 7.0 g/cm³. The sintered particle size was 10 μm.

EXAMPLE 8

Aqueous ammonia was continuously mixed into a 0.6 mol/l indium nitrate aqueous solution in a reaction tank to obtain a slurry. The temperature of the indium nitrate aqueous solution was 85° C. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 22 m²/g. The crystalline size of the indium oxide powder by X-ray diffraction was 400 Å. The primary particle size obtained by the particle size distribution measurement was 0.08 μm (the BET size/the crystallite size=1.13).

Such an indium oxide powder was mixed with a tin oxide powder whose BET surface area was 2.0 m²/g in such a manner that the proportion of tin oxide was 10 wt %. The mixture powder was molded under a pressure of 1.5 ton/cm². After the molded part was treated by cold hydrostatic press under a pressure of 3 ton/cm², it was sintered in the same manner as that of Example 1. The density of the obtained sintered body was 94% of the theoretical density thereof, which was 6.7 g/cm³. The sintered particle size was 9 μm.

EXAMPLE 9

A 1.5 mol/l indium nitrate aqueous solution having a temperature of 85° C. was mixed into aqueous ammonia at a mixing speed [In]/[OH] of 0.02 per minute to obtain a slurry. The proportion of the indium nitrate aqueous solution was a value which ensured a [OH]/[In] ratio of 4. The proportion of aqueous ammonia was 10 wt%. The slurry was filtered, washed and then dried at 110° C. to manufacture an indium hydroxide powder.

The thus-obtained indium hydroxide powder was temporarily sintered at 750° C. for 4 hours to manufacture an indium oxide powder. The BET specific surface area of the indium oxide powder was 22 m$^2$/g. The crystallite size of the indium oxide powder by X-ray diffraction was 450 Å. The primary particle size obtained by the particle size distribution measurement was 0.08 μm (the BET size/the crystallite size=1.13).

Such an indium oxide powder was mixed with a tin oxide powder whose BET surface area was 2.0 m$^2$/g in such a manner that the proportion of tin oxide was 10 wt %. The mixture powder was molded and sintered in the same manner as that of Example 1. The density of the obtained sintered body was 94% of the theoretical density thereof, which was 6.7 g/cm$^3$. The sintered particle size was 8 μm.

EXAMPLE 10

A transparent conductive film was formed by DC magnetron sputtering under the conditions listed in Table 1 using the sintered body obtained in Example 1 as a target.

The specific resistance of the obtained film was $1.6 \times 10^{-4}$ Ω cm, $2.2 \times 10^{-4}$ Ω cm and $3.3 \times 10^{-4}$ Ω cm, at a substrate temperature of 300° C., 200° C. and 120° C., respectively.

EXAMPLE 11

A tin oxide powder whose BET surface area was 0.10 m$^2$/g and average secondary particle size was 6 μm was mixed into the indium oxide powder obtained in Example 1. The mixture powder was molded and sintered in the same manner as that of Example 1.

The sintering density of the obtained sintered body was 97% of the theoretical density thereof, which was 6.9 g/cm$^3$. The sintered particle size was 8 μm.

EXAMPLE 12

A tin oxide powder whose BET surface area was 2.45 m$^2$/g and average secondary particle size was 10 μm was mixed into the indium oxide powder obtained in Example 1. The mixture powder was molded and sintered in the same manner as that of Example 1.

The sintering density of the obtained sintered body was 95% of the theoretical density thereof, which was 6.8 g/cm$^3$. The sintered particle size was 7 μm.

EXAMPLE 13

A tin oxide powder was mixed into an indium oxide powder in such a manner that the proportion of tin oxide was 10 wt %. The tin oxide powder had a BET surface area of 0.02 m$^2$/g, and an average secondary particle size of 7 μm. The indium oxide powder had a BET surface area of 22 m$^2$/g, a crystallite size by X-ray crystal diffraction of 400 Å, and a primary particle size by particle size distribution of 0.08 μm. The mixture powder was molded under a pressure of 1.5 ton/cm$^2$. After the molded part was treated by CIP under a pressure of 3 ton/cm$^2$, it was sintered at 1400° C. under the atmospheric pressure for 5 hours.

The diameter of the obtained sintered body was 100 m Φ. The density thereof was 98% of the theoretical density, and was 7.01 g/cm$^3$. The particle size of the sintered body was 7 μm.

EXAMPLE 14

A transparent conductive film was formed by DC magnetron sputtering under the conditions listed in Table 1 using the sintered body obtained in Example 11 as a target.

The specific resistance of the obtained film was $1.5 \times 10^{-4}$ Ω cm, $2.0 \times 10^{-4}$ Ω cm and $3.2 \times 10^{-4}$ Ω cm, at a substrate temperature of 300° C., 200° C. and 120° C., respectively.

EXAMPLE 15

Tin oxide powder whose BET surface area was 0.3 m$^2$/g was mixed into the indium oxide powder obtained in Example 1 at a proportion of 10 wt %. The mixture powder was molded. After the molded part was treated by CIP under a pressure of 5 ton/cm$^2$, it was sintered at 1280° C. under a divided oxygen pressure of 0.25 atm for 5 hours.

The sintering density of the obtained sintered body was 90%. The sintering particle size was 1 μm. No solid solution phase of $(In_{0.6}Sn_{0.4})_2O_3$ was seen.

EXAMPLE 16

Tin oxide powder whose BET surface area was 0.3 m$^2$/g was mixed into the indium oxide powder obtained in Example 1 at a proportion of 10 wt %. The mixture powder was molded. Thereafter, the molded part was sintered at 1600° C. under a divided oxygen pressure of 0.8 atm for 5 hours.

The sintering density of the obtained sintered body was 90%. The sintering particle size was 20 μm. The proportion of the solid solution phase of $(In_{0.6}Sn_{0.4})_2O_3$ was 1%.

EXAMPLE 17

Tin oxide powder whose BET surface area was 0.3 m$^2$/g was mixed into the indium oxide powder obtained in Example 1 at a proportion of 10 wt %. The mixture powder was molded. After the molded part was treated by CIP under a pressure of 2 ton/cm$^2$, it was sintered at 1600° C. under a divided oxygen pressure of 0.8 atm for 5 hours.

The sintering density of the obtained sintered body was 99%. The sintering particle size was 20 μm. The proportion of the solid solution phase of $(In_{0.6}Sn_{0.4})_2O_3$ was 1%.

EXAMPLE 18

Tin oxide powder whose BET surface area was 0.3 m$^2$/g was mixed into the indium oxide powder obtained in Example 1 at a proportion of 10 wt %. The mixture powder was molded. After the molded part was treated by CIP twice under a pressure of 5 ton/cm$^2$, it was sintered at 1350° C. under a divided oxygen pressure of 0.8 atm for 5 hours.

The sintering density of the obtained sintered body was 98%. The sintering particle size was 1 μm. The proportion of the solid solution phase of $(In_{0.6}Sn_{0.4})_2O_3$ was 0%.

EXAMPLE 19

Tin oxide powder whose BET surface area was 0.3 m$^2$/g was mixed into the indium oxide powder obtained in Example 1 at a proportion of 10 wt %. The mixture powder was molded. Thereafter, the molded part was sintered at 1350° C. under a divided oxygen pressure of 0.25 atm for 5 hours.

The sintering density of the obtained sintered body was 91%. The sintering particle size was 2 μm. The proportion of the solid solution phase of $(In_{0.6}Sn_{0.4})_2O_3$ was 8%.

EXAMPLE 20

Tin oxide powder whose BET surface area was 0.3 m$^2$/g was mixed into the indium oxide powder obtained in Example 1 at a proportion of 10 wt %. The mixture powder was molded. Thereafter, the molded part was sintered at 1600° C. under a divided oxygen pressure of 0.25 atm for 5 hours.

The sintering density of the obtained sintered body was 92%. The sintering particle size was 20 μm. The proportion of the solid solution phase of $(In_{0.6}Sn_{0.4})_2O_3$ was 9%.

EXAMPLE 21

Tin oxide powder whose BET surface area was 0.3 m$^2$/g was mixed into the indium oxide powder obtained in Example 1 at a rate of 10 wt %. The mixture powder was molded. After the molded part was treated by CIP under a pressure of 5 ton/cm$^2$, it was sintered at 1600° C. under a divided oxygen pressure of 0.5 atm for 5 hours.

The sintering density of the obtained sintered body was 99%. The sintering particle size was 20 μm. The proportion of the solid solution phase of $(In_{0.6}Sn_{0.4})_2O_3$ was 9%.

EXAMPLE 22

Tin oxide powder whose BET surface area was 0.3 m$^2$/g was mixed into the indium oxide powder obtained in Example 1 at a proportion of 10 wt %. The mixture powder was molded. After the molded part was treated twice by CIP under a pressure of 5 ton/cm$^2$, it was sintered at 1350° C. under a divided oxygen pressure of 0.25 atm for 5 hours.

The sintering density of the obtained sintered body was 98%. The sintering particle size was 2 μm. The proportion of the solid solution phase of $(In_{0.6}Sn_{0.4})_2O_3$ was 10%.

EXAMPLE 23

Tin oxide powder whose BET surface area was 0.3 m$^2$/g was mixed into the indium oxide powder obtained in Example 1 at a proportion of 10 wt %. The mixture powder was molded. After the molded part was treated by CIP twice under a pressure of 5 ton/cm$^2$, it was sintered at 1450° C. under a divided oxygen pressure of 0.7 atm for 5 hours.

The sintering density of the obtained sintered body was 98%. The sintering particle size was 10 μm. The proportion of the solid solution phase of $(In_{0.6}Sn_{0.4})_2O_3$ was 3%.

EXAMPLE 24

A transparent conductive film was formed by DC magnetron sputtering under the conditions listed in Table 1 using the sintered body obtained in Example 15 as a target.

The specific resistance of the obtained film was $2.0 \times 10^{-4}$ Ω cm, $2.4 \times 10^{-4}$ Ω cm and $3.4 \times 10^{-4}$ Ω cm, at a substrate temperature of 300° C., 200° C. and 120° C., respectively.

COMPARATIVE EXAMPLE 1

Aqueous ammonia was mixed into a 0.5 mol/l indium nitrate aqueous solution having a temperature of 85° C. at a mixing speed [OH]/[In] of 0.01 per minute to obtain a slurry. The proportion of aqueous ammonia was 10 wt % and ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 14 m$^2$/g. The crystallite size of the indium oxide powder by X-ray diffraction was 400 Å. The primary particle size obtained by the particle size distribution measurement was 0.12 μm (the BET size/the crystallite size = 1.78).

Such an indium oxide powder was mixed with a tin oxide powder whose BET surface area was 2.0 m$^2$/g in such a manner that the proportion of tin oxide was 10 wt %. Thereafter, the mixture powder was molded under a pressure of 1.5 ton/cm$^2$. After the molded part was treated by cold hydrostatic press under a pressure of 3 ton/cm$^2$, it was sintered under the atmospheric pressure at 1400° C. for 5 hours. The diameter of the obtained sintered body was 100 mm Φ. The density of the sintered body was 80% of the theoretical density thereof, which was 5.7 g/cm$^3$.

COMPARATIVE EXAMPLE 2

Aqueous ammonia was mixed into a 0.5 mol/l indium nitrate aqueous solution having a temperature of 30° C. at a mixing speed [OH]/[In] of 0.8 per minute to obtain a slurry. The proportion of aqueous ammonia was 10 wt % which ensured a [OH]/[In] ratio of 4. The slurry was filtered, washed and then dried at 110° C. to manufacture an indium hydroxide powder.

The thus-obtained indium hydroxide powder was calcined at 750° C. for 4 hours to manufacture an indium oxide powder. The BET specific surface area of the indium oxide powder was 11 m$^2$/g. The crystallite size of the indium oxide powder by X-ray diffraction was 400 Å. The primary particle size obtained by the particle size distribution measurement was 0.11 μm (the BET size/the crystallite size = 2.27).

Such an indium oxide powder was mixed with a tin oxide powder whose BET surface area was 2.0 m$^2$/g in such a manner that the proportion of tin oxide was 10 wt %. Thereafter, the mixture powder was molded under a pressure of 1.5 ton/cm$^2$. After the molded part was treated by cold hydrostatic press under a pressure of 3 ton/cm$^2$, it was sintered under the atmospheric pressure at 1400° C. for 5 hours. The diameter of the obtained sintered body was 100 mm Ω. The density of the sintered body was 81% of the theoretical density thereof, which was 5.8 g/cm$^3$.

COMPARATIVE EXAMPLE 3

A transparent conductive film was formed by DC magnetron sputtering under the conditions listed in Table 1 using the sintered body obtained in Comparative Example 1 as a target.

The specific resistance of the obtained film was $2.1 \times 10^{-4}$ Ω cm, $2.9 \times 10^{-4}$ Ω cm and $4.5 \times 10^{-4}$ Ω cm, at a substrate temperature of 300° C., 200° C. and 120° C., respectively. Particularly, the film characteristics at low temperatures were degraded.

COMPARATIVE EXAMPLE 4

A transparent conductive film was formed by DC magnetron sputtering under the conditions listed in Table 1 using the sintered body obtained in Comparative Example 2 as a target.

The specific resistance of the obtained film was $2.1 \times 10^{-4}$ Ω cm, $2.9 \times 10^{-4}$ Ω cm and $4.5 \times 10^{-4}$ Ω cm, at a substrate temperature of 300° C., 200° C. and 120° C., respectively. Particularly, the film characteristics at low temperature were degraded.

TABLE 1

| Type of sputtering | DC magnetron sputtering |
|---|---|
| Temperature of substrate | 120° C. to 300° C. |
| Distance between the Target and the substrate | 40 mm |
| Gas pressure | $3 \times 10^{-3}$ Torr |
| Sputtering gas | Argon |
| Supplied power | 33 W |
| Thickness of the film | 2000 Å |
| Substrate | Corning #7059 glass |

What is claimed is:

1. A method of manufacturing indium oxide, comprising the steps of:
   mixing an aqueous indium salt solution having a temperature of 60° to 100° C. and an aqueous alkali solution in amounts such that from 3 to 5 moles of hydroxide of the aqueous alkali solution are combined per mole of indium of the indium salt by mixing the aqueous alkali solution into the aqueous indium salt solution at a mixing speed in which the amount of hydroxide added to the indium salt solution is not less than 0.15 mole per minute per mole of indium before the mixing; and
   calcining the indium hydroxide obtained.

2. A method of manufacturing indium oxide, comprising the steps of:
   mixing an aqueous indium salt solution having a temperature of 60° to 100° C. and an aqueous alkali solution in amounts such that from 3 to 5 moles of hydroxide of the aqueous alkali solution are combined per mole of indium of the indium salt by mixing the aqueous alkali solution into the aqueous indium salt solution at a mixing speed in which the amount of hydroxide added to the indium salt solution is 0.01 mole or above per minute per mole of indium before mixing; and
   calcining the indium hydroxide obtained.

3. A method of manufacturing indium oxide, comprising the steps of:
   mixing an aqueous indium salt solution having a temperature of 60° to 100° C. and an aqueous alkali solution in amounts such that from 3 to 5 moles of hydroxide of the aqueous alkali solution are combined per mole of indium of the indium salt by continuously supplying the aqueous indium salt solution and the aqueous alkali solution as they are combined; and
   calcining the indium hydroxide obtained.

4. A method of manufacturing an ITO sintered body, comprising the steps of:
   preparing indium hydroxide by adding an aqueous alkali or ammonium hydroxide solution to an aqueous indium salt solution at a temperature of from 60° to 100° C. at a mixing ratio in gram equivalents of the alkali or ammonium hydroxide to indium, (OH)/(In) ranging from 3 to 5, at a mixing speed in which the amount of hydroxide added to the indium salt solution is not less than 0.15 mole per minute per mole of indium before mixing;
   separating the indium hydroxide which is formed;
   calcining the indium hydroxide to indium oxide;
   mixing the indium oxide with from 3 to 15% by weight, based on the amount of indium oxide, of tin oxide;
   molding the resulting powdered mixture; and
   sintering the molded mixture.

5. A method of manufacturing an ITO sintered body, comprising the steps of:
   preparing indium hydroxide by adding an aqueous indium salt solution to an aqueous alkali or ammonium hydroxide solution in a mixing ratio in gram equivalents of the alkali or ammonium hydroxide to indium, (OH/In), ranging from 3 to 5 at a mixing speed in which the amount of hydroxide added to the indium salt solution is not less than 0.01 mole per minute per mole of indium before mixing;
   separating the indium hydroxide which forms;
   calcining the indium hydroxide to indium oxide;
   mixing the indium oxide with from 3 to 15% by weight, based on the amount of indium oxide, of tin oxide;
   molding the resulting powdered mixture; and
   sintering the molded mixture.

6. A method of manufacturing an ITO sintered body, comprising the steps of:
   preparing indium hydroxide by feeding continuously an aqueous indium salt solution into an aqueous alkali or ammonium hydroxide solution in a mixing ration in gram equivalents of the alkali or ammonium hydroxide to indium (OH/In) ranging from 3 to 5;
   separating the indium hydroxide which forms;
   calcining the indium hydroxide to indium oxide;
   mixing the indium oxide with from 3 to 15% by weight, based on the amount of indium oxide, of tin oxide;
   molding the resulting powdered mixture; and
   sintering the molded mixture.

7. The method of manufacturing an ITO sintered body according to claim 4, wherein the tin oxide has a BET surface area of not more than 3 m²/g.

8. The method of manufacturing an ITO sintered body according to claim 5, wherein the tin oxide has a BET surface area of not more than 3 m²/g.

9. The method of manufacturing an ITO sintered body according to claim 6, wherein the tin oxide has a BET surface area of not more than 3 m²/g.

10. The method of claim 9, wherein sintering of the molded mixture is conducted at atmospheric pressure in the presence of air, oxygen or an inert atmosphere.

* * * * *